(12) United States Patent
Kawakami et al.

(10) Patent No.: US 7,977,685 B2
(45) Date of Patent: Jul. 12, 2011

(54) LIGHT-EMITTING DEVICE

(75) Inventors: Takahiro Kawakami, Kanagawa (JP); Kaoru Tsuchiya, Kanagawa (JP); Takeshi Nishi, Kanagawa (JP); Yoshiharu Hirakata, Kanagawa (JP); Keiko Kida, Kanagawa (JP); Ayumi Sato, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 350 days.

(21) Appl. No.: 11/947,536

(22) Filed: Nov. 29, 2007

(65) Prior Publication Data

US 2008/0079362 A1    Apr. 3, 2008

Related U.S. Application Data

(63) Continuation of application No. 11/041,890, filed on Jan. 25, 2005, now Pat. No. 7,315,047.

(30) Foreign Application Priority Data

Jan. 26, 2004    (JP) ................................. 2004-017536

(51) Int. Cl.
*H01L 27/15* (2006.01)
(52) U.S. Cl. .......................................................... 257/83
(58) Field of Classification Search .................... 257/83, 257/84, 103, E21.413, E27.111
See application file for complete search history.

(56) References Cited

U.S. PATENT DOCUMENTS

| | | | |
|---|---|---|---|
| 5,897,328 A | 4/1999 | Yamauchi et al. | |
| 5,986,729 A | 11/1999 | Yamanaka et al. | |
| 6,147,667 A | 11/2000 | Yamazaki et al. | |
| 6,448,580 B1 | 9/2002 | Arai et al. | |
| 6,674,106 B2 | 1/2004 | Tanaka et al. | |
| 6,724,150 B2 | 4/2004 | Maruyama et al. | |
| 6,731,367 B1 | 5/2004 | Saitoh | |
| 6,734,463 B2 | 5/2004 | Ishikawa | |
| 6,760,004 B2 | 7/2004 | Koyama | |
| 6,776,847 B2 | 8/2004 | Yamazaki et al. | |
| 6,781,746 B2 | 8/2004 | Yamazaki et al. | |

(Continued)

FOREIGN PATENT DOCUMENTS

CN    1419297    5/2003

(Continued)

OTHER PUBLICATIONS

Chinese Office Action (Application No. 2005/10006890.8), dated Jul. 4, 2008 with English translation.

(Continued)

*Primary Examiner* — Andy Huynh
(74) *Attorney, Agent, or Firm* — Nixon Peabody LLP; Jeffrey L. Costellia (57) ABSTRACT

A light-emitting device is disclosed capable of reducing the variation of an emission spectrum depending on an angle of viewing a light extraction surface. More particularly, a light-emitting device is disclosed capable of preventing impurities from dispersing from a light-emitting element into a thin film transistor as well as reducing the variation of an emission spectrum depending on an angle of viewing a light extraction surface. The disclosed light-emitting device comprises a substrate; a first insulating layer provided over the substrate; a transistor provided over the first insulating layer; and a second insulating layer having a first opening portion so that the transistor is covered and the substrate is exposed; wherein a light-emitting element is provided inside the first opening portion.

22 Claims, 8 Drawing Sheets

U.S. PATENT DOCUMENTS

| | | |
|---|---|---|
| 6,791,129 B2 | 9/2004 | Inukai |
| 6,798,442 B1 | 9/2004 | Kim et al. |
| 6,828,726 B2 | 12/2004 | Sakurai et al. |
| 6,850,005 B2 | 2/2005 | Yoneda et al. |
| 6,861,710 B2 | 3/2005 | Murakami et al. |
| 6,888,304 B2 | 5/2005 | Sato |
| 6,903,377 B2 | 6/2005 | Yamazaki et al. |
| 6,958,252 B2 | 10/2005 | Kim |
| 6,967,438 B2 | 11/2005 | Sasatani et al. |
| 6,967,763 B2 * | 11/2005 | Fujii et al. .................... 359/297 |
| 7,019,714 B2 | 3/2006 | Uchida et al. |
| 7,042,024 B2 | 5/2006 | Yamazaki et al. |
| 7,068,343 B2 | 6/2006 | Saitoh |
| 7,095,046 B2 | 8/2006 | Ishikawa |
| 7,178,927 B2 | 2/2007 | Seo |
| 7,316,983 B2 | 1/2008 | Yamazaki et al. |
| 7,511,420 B2 | 3/2009 | Adachi et al. |
| 2002/0014628 A1 | 2/2002 | Koyama |
| 2002/0047120 A1 | 4/2002 | Inukai |
| 2002/0140643 A1 | 10/2002 | Sato |
| 2002/0180371 A1 * | 12/2002 | Yamazaki et al. ......... 315/169.3 |
| 2002/0187575 A1 * | 12/2002 | Maruyama et al. ............. 438/33 |
| 2003/0089991 A1 * | 5/2003 | Yamazaki et al. ............ 257/759 |
| 2003/0116768 A1 | 6/2003 | Ishikawa |
| 2003/0127651 A1 * | 7/2003 | Murakami et al. .............. 257/72 |
| 2003/0129790 A1 | 7/2003 | Yamazaki et al. |
| 2003/0206332 A1 | 11/2003 | Yamazaki et al. |
| 2004/0065902 A1 | 4/2004 | Yamazaki et al. |
| 2004/0160171 A1 | 8/2004 | Takahashi et al. |
| 2004/0188692 A1 | 9/2004 | Ishikawa |
| 2005/0012445 A1 | 1/2005 | Yamazaki et al. |
| 2005/0145861 A1 | 7/2005 | Kawakami et al. |
| 2005/0161672 A1 | 7/2005 | Yamazaki et al. |
| 2005/0161680 A1 | 7/2005 | Kawakami et al. |
| 2005/0179372 A1 | 8/2005 | Kawakami et al. |
| 2005/0184652 A1 | 8/2005 | Maruyama et al. |
| 2005/0224820 A1 | 10/2005 | Yamazaki et al. |
| 2006/0097256 A1 | 5/2006 | Yamazaki et al. |
| 2006/0180826 A1 | 8/2006 | Yamazaki et al. |
| 2006/0192205 A1 | 8/2006 | Yamazaki et al. |
| 2006/0201620 A1 | 9/2006 | Seo |
| 2007/0029548 A1 | 2/2007 | Yamazaki et al. |
| 2008/0081115 A1 | 4/2008 | Yamazaki et al. |
| 2009/0115688 A1 | 5/2009 | Adachi et al. |

FOREIGN PATENT DOCUMENTS

| | | |
|---|---|---|
| CN | 1428817 | 7/2003 |
| CN | 1444422 | 9/2003 |
| EP | 1 227 390 A2 | 7/2002 |
| EP | 1 319 732 A1 | 6/2003 |
| GB | 2 286 081 | 8/1995 |
| JP | 7-211458 | 8/1995 |
| JP | 8-330600 | 12/1996 |
| JP | 10-020342 | 1/1998 |
| JP | 10-254383 | 9/1998 |
| JP | 10-289784 | 10/1998 |
| JP | 2000-162647 | 6/2000 |
| JP | 2000-227768 | 8/2000 |
| JP | 2001-242803 | 9/2001 |
| JP | 2001-264737 | 9/2001 |
| JP | 2002-202735 | 7/2002 |
| JP | 2002-304136 | 10/2002 |
| JP | 2003-077680 | 3/2003 |
| JP | 2003-084687 | 3/2003 |
| JP | 2004-070351 | 3/2004 |
| JP | 2005-031251 | 2/2005 |

OTHER PUBLICATIONS

Chinese Office Action (Application No. 200910139830.1) with English Translation dated Apr. 6, 2010.

* cited by examiner

LIGHT-EMITTING DEVICE

BACKGROUND OF THE INVENTION

1. Field of the Invention

The present invention relates to an active matrix light-emitting device, and more particularly, a structure of a portion for extracting light.

2. Related Art

A light-emitting device utilizing light from an electroluminescent element (light-emitting element) has attracted attention as a low power consumption display device having a wide viewing angle.

As a driving method for a light-emitting device that is used mainly as a display device, an active matrix driving method and a passive matrix driving method can be used. An active matrix light-emitting device can control emission and non-emission of every light-emitting element. Therefore, an active matrix light-emitting device can operate with lower power consumption than that of a passive matrix light-emitting device. The active matrix light-emitting device is suitable for mounting to not only a display portion of a small electric appliance such as a cellular phone but also a display portion of a large TV set.

In an active matrix light-emitting device, a circuit for controlling the drive of each light-emitting element is provided to each of the light-emitting element. The circuit and the light-emitting element are provided over a substrate so that extraction of light to the exterior is not prevented by the circuit. A portion overlapped with the light-emitting element is provided with a laminated insulating layer having a light transmitting property. Light is emitted outside by passing through the insulating layer. The insulating layer is provided to form a circuit element such as a transistor or a capacitor element, each of which is a component of the circuit; or a wiring.

When light passes through the laminated insulating layer, light emission may multiply interacted with each other due to the difference of refractive index of each the insulating layer. As a result, an emission spectrum is varied depending on an angle of viewing a light extraction surface, which leads to a problem of deterioration of visibility of an image displayed on the light-emitting device.

The deterioration of visibility of an image due to the difference of refractive index of each layer may be occurred in a passive matrix light-emitting device. For example, Unexamined Patent Publication No. 7-211458 disclosed a light-emitting element with an improved structure to solve a problem of deterioration of visibility of an image caused by the reflection of external light and light emission at an interface due to the difference of refractive index of each layer composing a light-emitting element.

SUMMARY OF THE INVENTION

It is an object of the present invention to provide a light-emitting device capable of reducing the variation of an emission spectrum depending on an angle of viewing a light extraction surface. It is more specific object of the present invention to provide a light-emitting device capable of preventing impurities from dispersing from a light-emitting element into a thin film transistor as well as reducing the variation of an emission spectrum depending on an angle of viewing a light extraction surface.

The present invention provides a light-emitting device comprising a substrate; a first insulating layer provided over the substrate; a transistor provided over the first insulating layer; and a second insulating layer provided with a first opening portion so that the transistor is covered and the substrate is exposed; wherein a light-emitting element is provided inside the first opening portion.

The transistor and the light-emitting element are electrically connected with each other via a connecting portion. The connecting portion is connected to the transistor by passing through a contact hole that penetrates into the second insulating layer.

The second insulating layer may be a single layer or multiple layers of a plurality layers made from different materials, preferably, a layer made from silicon oxide containing oxygen.

The present invention provides a light-emitting device comprising a substrate; a first insulating layer provided over the substrate; a transistor provided over the first insulating layer; and a second insulating layer provided with a first opening portion so that the transistor is covered and the substrate is exposed; wherein a first electrode, a light-emitting layer, and a second electrode are sequentially stacked over the substrate inside the first opening portion.

The transistor and the light-emitting element are electrically connected with each other via a connecting portion. The connecting portion is connected to the transistor by passing through a contact hole that penetrates into the second insulating layer.

The second insulating layer may be a single layer or multiple layers made from different materials, preferably, a layer made from silicon oxide containing oxygen.

The present invention provides a light-emitting device comprising a substrate; a first insulating layer provided over the substrate; a transistor provided over the first insulating layer; a second insulating layer provided with a first opening portion so that the transistor is covered and the substrate is exposed; and a third insulating layer for covering the first opening portion and the second insulating layer; wherein a first electrode, a light-emitting layer, and a second electrode are sequentially stacked over the substrate inside the first opening portion.

The transistor and the light-emitting element are electrically connected with each other via a connecting portion. The connecting portion is connected to the transistor by passing through a contact hole that penetrates into the second insulating layer.

The second insulating layer may be a single layer or multiple layers made from different materials, preferably, a layer made from silicon oxide containing oxygen. The third layer is preferably made from silicon nitride containing oxygen.

The present invention provides a light-emitting device comprising a substrate; a first insulating layer provided over the substrate; a transistor provided over the first insulating layer; a second insulating layer provided with a first opening portion so that the transistor is covered and the substrate is exposed; a first electrode for covering the first opening portion; a bank layer provided with a second opening portion so that the first electrode is exposed; a light-emitting layer provided over the first electrode in the second opening portion; and a second electrode provided over the light-emitting layer.

The transistor and the light-emitting element are electrically connected with each other via a connecting portion. The connecting portion is connected to the transistor by passing through a contact hole that penetrates into the second insulating layer.

The second insulating layer may be a single layer or multiple layers made from different materials, preferably, a layer made from silicon oxide containing oxygen. The third layer is preferably made from silicon nitride containing oxygen.

According to the present invention, a light-emitting device with reduced variation of an emission spectrum depending on an angle of viewing a light extraction surface can be obtained.

By reducing the variation of an emission spectrum depending on an angle of viewing a light extraction surface, a display device and the like that can provide an image having good visibility can be obtained.

These and other objects, features and advantages of the present invention will become more apparent upon reading of the following detailed description along with the accompanied drawings.

DESCRIPTION OF THE INVENTION

Embodiment 1

A light-emitting device according to the present invention is explained with reference to FIG. 1.

An insulating layer 12 formed by two layers of an insulating layer 12a and an insulating layer 12b is provided over a substrate 11. A staggered transistor 16 including a semiconductor layer 13, a gate insulating layer 14 and a gate electrode 15 is provided over the insulating layer 12b.

The transistor 16 is covered by an insulating layer 17 having a first opening portion. The insulating layer 17 is formed by, but not exclusively, two layers of an insulating layer 17a (lower layer) and an insulating layer 17b (upper layer). The insulating layer 17 may be formed by a single layer or three or more layers. Further, the first opening portion penetrates into the gate insulating layer 14 and the insulating layer 12 to reach the substrate 11. Therefore, a part of the substrate 11 is exposed from the first opening portion.

The insulating layer 17 and the first opening portion are covered by an insulating layer 18. Inside the first opening portion, the insulating layer 18 and the substrate 11 are overlapped to be in contact with each other.

A light-emitting element 24 is composed of a first electrode 20, a second electrode 23, and a light-emitting layer 22 interposed between these electrodes; and is provided over the insulating layer 18. The first electrode 20 and the insulating layer 18 are overlapped to be in contact with each other.

The transistor 16 is electrically connected to the light-emitting element 24 via a connecting portion 19a made from a conductor. The connecting portion 19a is provided over the insulating layer 18 to be reached the semiconductor layer 13 by passing through a contact hole that penetrates into the insulating layers 17 and 18. The connecting portion 19a is electrically connected to the first electrode 20 by being a part of the connecting portion 19a in contact with the first electrode 20.

The connecting portion 19a, a wiring 19b, the insulating layer 18, and the like are covered by a bank layer 21 having a second opening portion that is provided to expose a part of the first electrode 20. In the second opening portion, the light-emitting layer 22 is provided over the first electrode 20 and the second electrode 23 is provided over the light-emitting layer 22. The laminated portion of the first electrode 20, the light-emitting layer 22, and the second electrode 23 serve as the light-emitting element 24. Further, the light-emitting layer 22 is formed by a single layer or multiple layers containing a light-emitting material.

In this embodiment, the substrate 11 is formed by a material transparent to visible light such as glass. Besides, resin having flexibility such as plastic can be used as the substrate 11. Alternatively, any material can be used as the substrate 11, as long as it has a light transmitting property and serves as a support medium for supporting the transistor 16 or the light-emitting element 24.

The insulating layer 12a and the insulating layer 12b are made of a material that can prevent impurities from dispersing from the substrate 11. Especially, the insulating layer 12a is preferably a layer having a function of preventing impurities from dispersing. Further, the insulating layer 12b is preferably a layer having a small stress difference from that of the semiconductor layer 13 as well as having a function of preventing impurities from dispersing. As such the layers, a layer made from silicon oxide can be used. The layer made from the silicon oxide may contain nitrogen of several % or less. The insulating layer 12 is not always required to be formed by two layers. In the case that impurities can be prevented from dispersing from the substrate 11 by providing only the insulating layer 12a, the insulating layer 12b is not always required to be provided between the semiconductor layer 13 and the insulating layer 12a.

The insulating layer 17a is preferably made from silicon nitride capable of being detected to contain an oxygen element of from 5 to 6% by Rutherford Backscattering Spectrometry/Hydrogen Forward scattering Spectrometry (RBS/HFS). Hydrogen is included in such the layer. Accordingly, hydrogen treatment can be carried out by using the hydrogen. Further, the layer serves to prevent impurities from dispersing into the transistor.

The insulating layer 18 is preferably made from a material having low moisture permeability, higher refractive index than that of the substrate 11, and lower refractive index than that of the first electrode 20. Especially, the insulating layer 18 is preferably made from silicon nitride capable of being detected to contain an oxygen element of from 5 to 6% by Rutherford Backscattering Spectrometry/Hydrogen Forward scattering Spectrometry (RBS/HFS). Such the layer has high blocking capability of impurities and is hardly permeable to moisture. Accordingly, the impurities can be prevented from dispersing from the light-emitting element 24 into the transistor 16. In the case that the insulating layer 17 is made from a material having high moisture permeability, the layer can serve to prevent moisture from penetrating into the light-emitting element 24 via the insulating layer 17. When there is no problem of moisture penetration into the light-emitting element, the insulating layer 18 is not always required to be provided.

Further, the first electrode 20 may be made from a conductor transparent to visible light such as indium tin oxide (ITO), ITO containing silicon oxide, indium zinc oxide (IZO) that is a mixture of indium oxide and 2 to 20% of zinc oxide (ZnO), or the like.

The insulating layer 171 may be multiple layers or a single layer. The insulating layer 17b may be made from either an inorganic material such as silicon oxide, siloxane, or silicon nitride; or an organic material such as acrylic or polyimide. Alternatively, the insulating layer 17b may be made from both of the inorganic and organic materials. At any rate, the insulating layer 17b may be an insulator. The insulating layer 17b preferably includes a layer made from a material having a self-smoothness property such as siloxane or acrylic to smooth the surface of the insulating layer 18. The surface of the insulating layer 17b may be smoothed by not only utilizing a material having a self-smoothness property but also polishing.

The light-emitting layer 22 may be made from either an organic material or an inorganic material. Alternatively, the light-emitting layer 22 may be made from both of an organic material and an inorganic material.

In the light-emitting device according to the present invention, the structure of the transistor 16 is not especially limited. The transistor 16 may be either a single gate transistor or a multi-gate transistor. Alternatively, the transistor 16 may have a single drain structure, an LDD (Lightly Doped Drain) structure, or a structure formed by overlapping an LDD region and a gate electrode.

Figure 1:
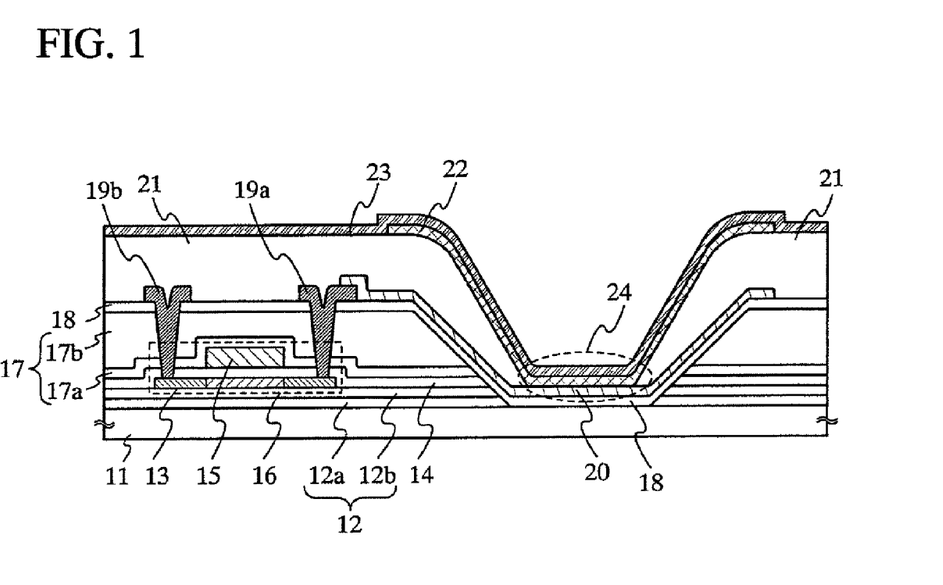
FIG. 1 is an explanatory cross-sectional view of a structure of a light-emitting device according to the present invention.
Figure 2:
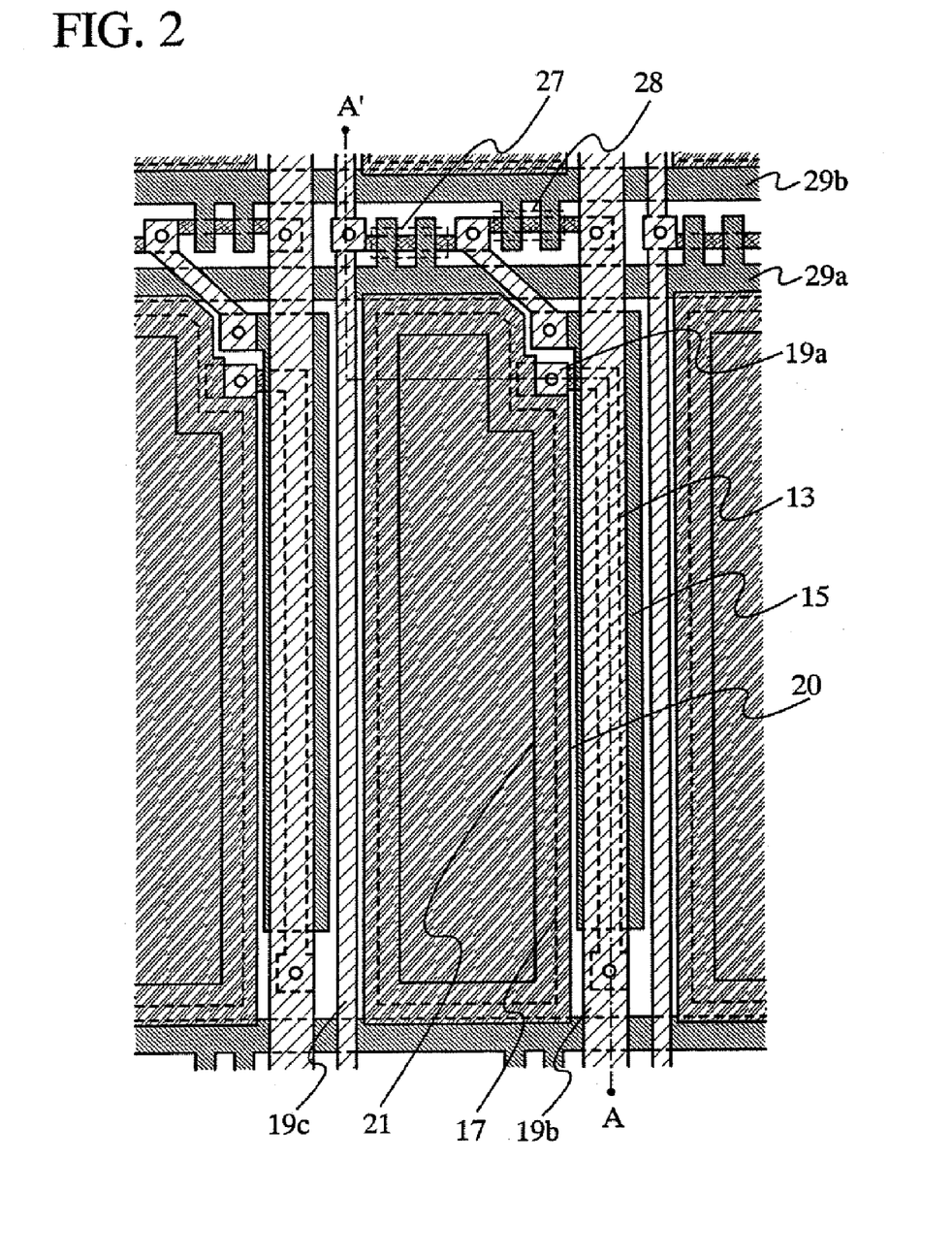
FIG. 2 is an explanatory top view of a structure of a light-emitting device according to the present invention.

FIG. 2 is a top view of the light-emitting device according to the present invention. The cross-sectional view of FIG. 1 illustrates a part of the cross-section of FIG. 2 taken along line of A-A'. Therefore, like components in FIG. 2 are denoted by like numerals as of FIG. 1. That is, reference numeral 13 denotes a semiconductor layer; 15, a gate electrode; 19b, a wiring; 19a, a connecting portion; 20, a first electrode; and 21, a bank layer. Although not shown in FIG. 1, reference numerals 19c, 29a, and 29b denote wirings; and 27 and 28 denote transistors.

In the foregoing light-emitting device, light from the light-emitting element 24 is emitted outside by passing through sequentially the first electrode 20, the insulating layer 18, and the substrate 11.

In the foregoing light-emitting device, light reflection during extracting light outside the light-emitting device can be reduced, and impurities can be sufficiently prevented from dispersing into the transistor from the substrate. Moreover, in the foregoing light-emitting device, multiple interaction due to reflection light can be restricted by reducing light reflection during extracting light outside. As a result of restricting the multiple interaction, the variation of an emission spectrum depending on an angle of viewing a light extraction surface can be decreased. Accordingly, the visibility of an image displayed on the light-emitting device can be improved.

Embodiment 2

In this embodiment, a method for manufacturing a light-emitting device illustrated in FIGS. 1 and 2 is explained with reference to FIGS. 3A to 4C.

Figure 3A:
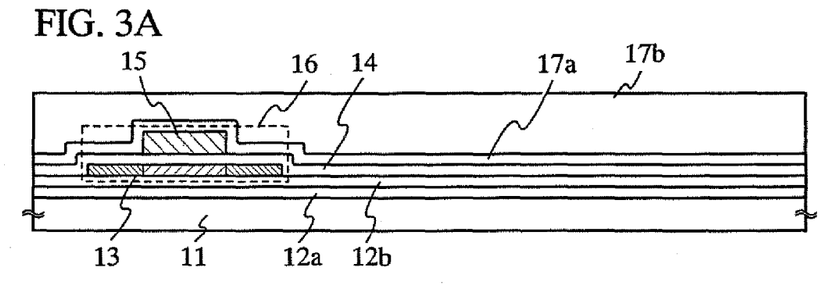
FIGS. 3A to 3E are explanatory views of a method for manufacturing a light-emitting device according to the present invention.

Insulating layers 12a and 12b are stacked over a substrate 11, and a semiconductor layer 13 is stacked over the insulating layer 12b.

The semiconductor layer 13 is processed into a desired form. The semiconductor layer 13 may be processed by etching with a resist mask.

A gate insulating layer 14 for covering the semiconductor layer 13, the insulating layer 12b, and the like, is formed, and a conductive layer is stacked over the gate insulating layer 14.

The conductive layer is processed into a desired form to form a gate electrode 15. Here, wirings 29a and 29b (FIG. 2) are formed as well as the gate electrode 15 is formed. The conductive layer may be processed by etching using a resist mask.

High concentrations of impurities are doped to the semiconductor layer 13 using the gate electrode 15 as a mask. Accordingly, a transistor 16 including the semiconductor layer 13, the gate insulating layer 14, and the gate electrode 15 can be manufactured.

The manufacturing process of the transistor 16 is not especially limited and may be modified appropriately to manufacture the transistor having a desired structure.

An insulating layer 17a that covers the gate electrode 15, the wirings 29a, 29b, the gate insulating layer 14, and the like is formed. In this embodiment, the insulating layer 17a is preferably made from silicon nitride capable of being detected to contain an oxygen element of from 5 to 6% by Rutherford Backscattering Spectrometry/Hydrogen Forward scattering Spectrometry (RBS/HFS). The layer made from silicon nitride containing an oxygen element of from 5 to 6% can be formed by using mixed gas as a raw material of monosilane ($SiH_4$), ammonia $NH_3$), dinitrogen monoxide $N_2O$), and hydrogen ($H_2$) having respectively a flow ratio of 1:10:2:40 by plasma CVD.

An insulating layer 17b that covers the insulating layer 17a is formed. In this embodiment, the insulating layer 17b is, but not exclusively, made from an inorganic material having a self-smoothness property such as siloxane. The insulating layer 17b may be made from an organic material having a self-smoothness property. Further, the insulating layer 17b is not always required to be made from a material having a self-smoothness property. The insulating layer 17b may be made from only a material with no self-smoothness property (FIG. 3A).

Figure 3B:
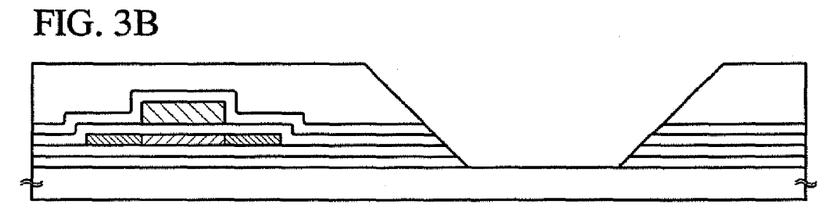

A first opening portion that penetrates the insulating layer 17 to reach the substrate 11 is formed by etching the insulating layer 17 formed by the insulating layers 17a and 17b and the like. Accordingly, the substrate 11 is exposed from the first opening portion (FIG. 3B).

Figure 3C:
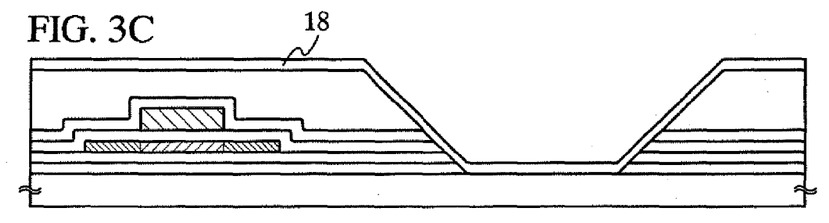

An insulating layer 18 that covers the first opening portion and the insulating layer 17 is formed. In this embodiment, the insulating layer 17a is made from silicon nitride capable of being detected to contain an oxygen element of from 5 to 6% by Rutherford Backscattering Spectrometry/Hydrogen Forward scattering Spectrometry (RBS/HFS) (FIG. 3C).

Figure 3D:
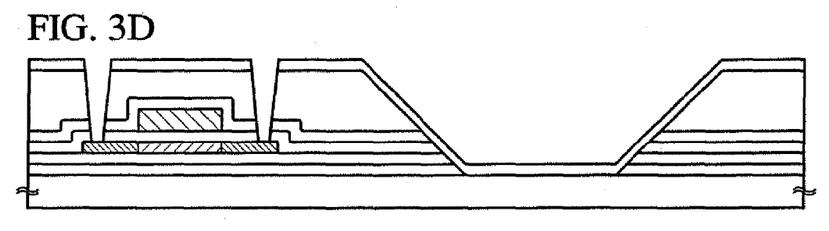

Heat treatment is performed at a temperature of from 350 to 500° C. Accordingly, hydrogen contained in the insulating layer 17 and the like is dispersed, which leads to the hydrogenation of the transistor 16. This process can be performed after forming the insulating layer 17a and before forming the insulating layer 17b (FIG. 3D).

Figure 3E:
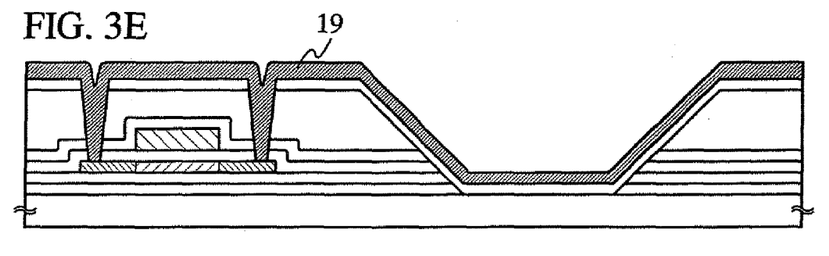
Figure 4A:
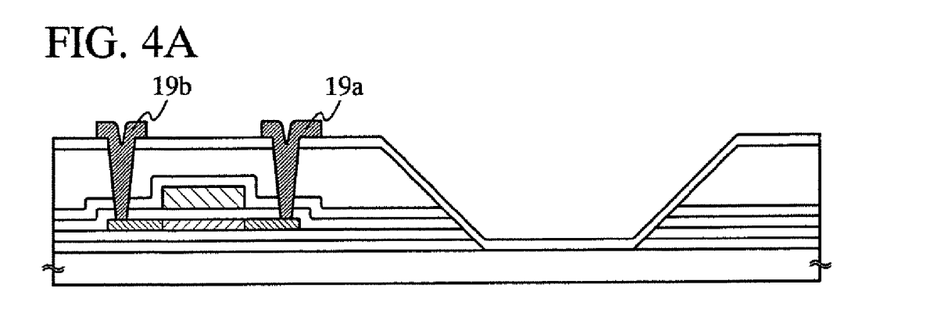
FIGS. 4A to 4C are explanatory views of a method for manufacturing a light-emitting device according to the present invention.

A conductive layer 19 that covers the insulating layer 18 and the like is formed (FIG. 3E). Then, the conductive layer 19 is processed into desired forms to form a connecting portion 19a, wirings 19b, 19c, a film 19d, and the like so that the substrate 11 is exposed from the first opening portion (FIG. 4A).

Figure 4B:
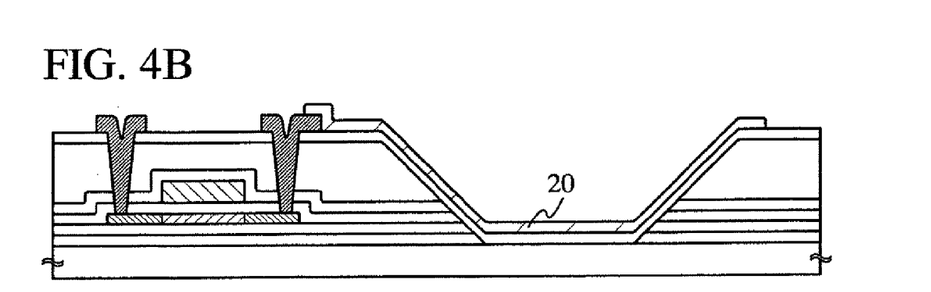

A conductive layer having a light transmitting property is formed in such a way that the connecting portion 19a and the like are covered by the conductive layer. Then, the conductive layer is processed to form a first electrode 20. In this embodiment, the first electrode 20 is processed to be partly in contact with the connecting portion 19a, and to cover an opening portion provided to the insulating layer 18. Here, the first electrode 20 is in contact with the substrate 11 via the insulating layer 18 (FIG. 4B).

Figure 4C:
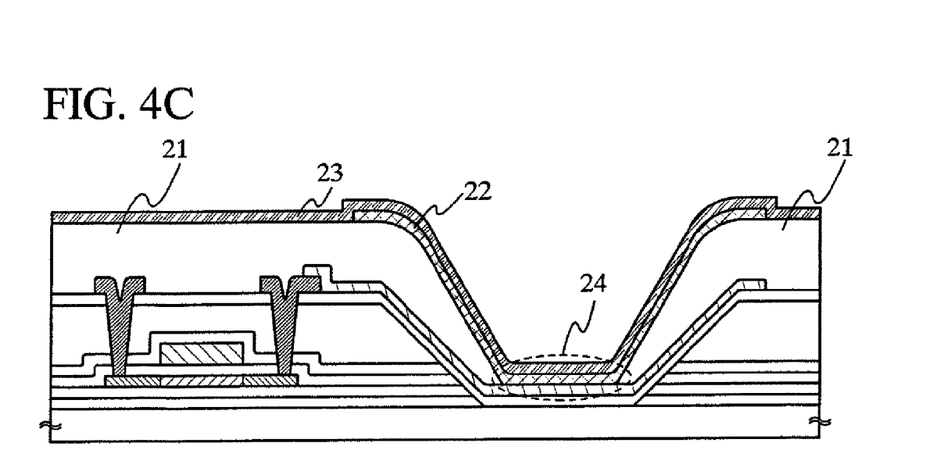

A bank layer 21 that has an opening portion to expose a part of the first electrode 20 and that covers the connecting portion 19a, the insulating layer 18, and the like is formed. The bank layer 21 may be formed by processing a photosensitive resin material into a desired form by exposure and development. Alternatively, the bank layer 21 may be formed by forming a layer made from a nonphotosensitive inorganic material or organic material, and etching to be processed into a desired form.

A light-emitting layer 22 that covers the first electrode 20 exposed from the bank layer 21 is formed. The light-emitting layer 22 may be formed by any one of vapor deposition, ink jetting, spin coating, or the like. In the case that the surface of the substrate 11 has irregularities, the irregularities can be relieved by providing a layer made from a high molecular material that is a mixture of poly(styrene sulfone) (PSS) and poly(ethylene dioxythiophene) (PEDOT) to a part of the light-emitting layer 22. A second electrode 23 that covers the light-emitting layer 22 is formed. Accordingly, a light-emitting element 24 composed of the first electrode 20, the light-emitting layer 22, and the second electrode 23 is formed.

Example 1

A light-emitting device according to the present invention is described in this example. Further, the structure of the light-emitting device according to the present invention, the material for constructing the light-emitting device according to the present invention, and the like are not limited to those explained in this example.

A light-emitting device according to this example is a light-emitting device according to the present invention having the cross-sectional structure as illustrated in FIG. 1.

In this example, a light-emitting layer 22 that is a component of a light-emitting element 24 is composed of a plurality of layers. The plurality of layers are formed by combining a plurality of layers, each of which is made from a material selected from the group consisting of a material having a high carrier transporting property or a material having a high carrier injecting property. The plurality of layers contains partly a material having a high light-emitting property. A material for forming the light-emitting layer 22 may be either an inorganic material or an organic material. In the case of using an organic material, either of a low molecular organic material or a high molecular organic material can be used.

As a light-emitting material, 4-dicyanomethylene-2-methyl-6-[*2-(1,1,7,7-tetramethyljulolidine-9-yl)ethenyl]-4H-pyran (abbreviated DCJT), 4-dicyanomethylene-2-t-butyl-6-[2-(1,1,7,7-tetramethyljulolidine-9-yl)ethenyl]-4H-pyran (abbreviated DPA), periflanthene, 2,5-dicyano-1,4-bis[2-(10-methoxy-1,1,7,7-tetramethyljulolidine-9-yl)ethenyl]benzene, N,N'-dimethylquinacridone (abbreviated DMQd), coumarin 6, coumarin 545T, tris(8-quinolinolato)aluminum (abbreviated $Alq_3$), 9,9'-biantrile, 9,10-diphenylantracene (abbreviated DPA), 9,10-bis(2-naphtyl)anthracene (abbreviated DNA), or the like can be used. Another material may be used.

Besides the foregoing singlet excited light-emitting material, a triplet excited material containing a metal complex or the like can be used. For example, among a red emitting pixel, a green emitting pixel, and a blue emitting pixel; a red emitting pixel having comparative short half-brightness life is formed by a triplet excited light-emitting material and the other are formed by singlet excited light-emitting materials.

The triplet excited light-emitting material has a characteristic that it requires lower power consumption than that of the singlet excited light-emitting material to obtain a certain level of luminance since the triplet excited light-emitting material has high luminous efficiency. In the case that the triplet excited light-emitting material is used for forming the red emitting pixel, the reliability can be improved since the light-emitting element requires a small amount of current. To reduce power consumption, the red emitting pixel and the green emitting pixel may be formed by the triplet excited light-emitting material, and the blue emitting pixel may be formed by a single excited light-emitting material. The power consumption of a green light-emitting element that has high visibility for human can be reduced by using the triplet excited light-emitting material for forming the green light-emitting element.

As an example for the triplet excited light-emitting material, a material using a metal complex as a dopant such as a metal complex including platinum that is the third transition element as a central metal or a metal complex including iridium as a central metal is well known. The triplet excited light-emitting material is not limited to these compounds. A compound that has the foregoing structure and that has an element belonging 8 to 10 groups in the periodic table as a central metal can be used.

As a material having a high carrier transporting property, especially, a material having a high electron transporting property, for example, a metal complex or the like having a quinoline skeleton or a benzoquinoline skeleton such as tris(8-quinolinolate) aluminum (abbreviated $Alq_3$), tris(5-methyl-8-quinolinolate) aluminum (abbreviated $Almq_3$), bis(10-hydroxybenzo[h]-quinolinato) beryllium (abbreviated $BeBq_2$), or bis(2-methyl-8-quinolinolato)-4-phenylphenolato-aluminum (abbreviated BAlq). As a material having a high hole transporting property, for example, aromatic amine (that is, the one having a benzene ring-nitrogen bond) based compounds such as 4,4'-bis[N-(1-naphthyl)-N-phenyl-amino]-biphenyl (abbreviated α-NPD), 4,4'-bis[N-(3-methylphenyl)-N-phenyl-amino]-biphenyl (abbreviated TPD), 4,4',4"-tris(N,N-diphenyl-amino)-triphenyl amine (abbreviated TDATA), and 4,4',4"-tris[N-(3-methylphenyl)-N-phenyl-amino]-triphenylamine (abbreviated MTDATA) can be nominated. As a material having a high carrier injecting property, especially, a material having a high electron injecting property, a compound of an alkali metal or an alkali earth metal such as lithium fluoride (LiF), cesium fluoride (CsF), calcium fluoride ($CaF_2$), or the like can be nominated. Besides, a mixture of a material having a high electron transportation property such as $Alq_3$ and an alkali earth metal such as magnesium (Mg). As a material having a high hole injecting property, for example, metal oxide such as molybdenum oxide (MoOx), vanadium oxide (VOx), ruthenium oxide (RuOx), tungsten oxide (WOx), manganese oxide (MnOx), or the like can be nominated. Besides, a phthalocyanine compound such as phthalocyanine (abbreviated $H_2Pc$) or copper phthalocyanine (CuPc) can be nominated. A high molecular material or the like that is a mixture of poly(ethylene dioxythiophene) (PEDOT) and poly(styrene sulfone) (PSS) having a high hole injecting property and a high hole transportation property can be used.

A high molecular organic light-emitting material has higher physical strength than that of a low molecular organic light-emitting material, and so a light-emitting element can be manufactured to have high durability. A light-emitting element can be comparatively readily manufactured since a light-emitting layer can be formed by coating.

A transistor 16 is a staggered TFT. Alternatively, the transistor 16 may be a reverse staggered TFT. Further, in the case of using the reverse staggered TFT, the transistor 16 may be a so-called channel protective TFT provided with a protective layer over a semiconductor layer or a so-called channel etching TFT provided with a partly etched semiconductor layer.

A semiconductor layer 13 may be either of a crystalline semiconductor layer or an amorphous semiconductor layer. Alternatively, the semiconductor layer 13 may be a semiamorphous semiconductor layer.

The semiamorphous semiconductor has an intermediate structure between an amorphous structure and a crystalline structure (including single crystals and poly crystals). The semiamorphous semiconductor has a stable third state with respect to free energy, and a crystalline region having a short-range order and lattice distortion. At least a part of the semiconductor includes crystal grains with grain diameters of from 0.5 to 20 nm. A raman spectrum is shifted to a lower wave number than $520\,cm^{-1}$. By X-ray diffraction, diffraction peaks (111), (220) that may be derived from a Si crystalline lattice are observed. Hydrogen or halogen of 1 atomic % or more is contained in the semiamorphous semiconductor as neutralizer for dangling bond. Such semiamorphous semiconductor is referred to as what is called micro crystal semiconductor. A silicide gas is used to be carried out with glow discharge decomposition (plasma CVD). As the silicide gas, $Si_2H_6$, $SiH_2Cl_2$, $SiHCl_3$, $SiCl_4$, $SiF_4$, or the like in addition to $SiH_4$ can be used. The silicide gas can be diluted by $H_2$, or the $H_2$ and one or a plurality of rare gas elements selected from the group consisting of He, Ar, Kr, and Ne. The dilution rate is in the range of from 2 to 1000 times. An applied voltage is in the range of from 0.1 to 133 Pa. A power source frequency is in the range of from 1 to 120 MHz, preferably, 13 to 60 MHz. A heat temperature for a substrate is at most 300° C., preferably, 100 to 250° C. As impurity elements in the film, atmospheric constituents such as oxygen, nitrogen, carbon, and the like have preferably concentrations of $1\times10^{20}/cm^{-1}$ or less, especially, oxygen concentration is $5\times10^{19}/cm^3$ or less, preferably, $1\times10^{19}/cm^3$ or less. A TFT (thin film transistor) including semiamorphous semiconductor has mobility of approximately from 1 to 10 $m^2/Vsec$.

As a specific example of a crystalline semiconductor layer, a semiconductor layer formed by single crystalline silicon, polycrystalline silicon, silicon germanium, or the like can be nominated. These semiconductor layers may be formed by laser crystallization, or crystallization by a solid phase growth method using nickel or the like.

In the case that a semiconductor layer is formed by an amorphous material, for example, amorphous silicon; a light-emitting device has preferably a circuit composed of the transistor 16 and the other transistors (for composing a circuit for driving a light-emitting element), each of which is formed by an N-channel type transistor. In the case that a semiconductor layer is formed by other material than the amorphous material, a light-emitting device may have a circuit composed of either an N-channel type transistor or a P-channel type transistor; or a light-emitting device may have a circuit composed of both of the N-channel type transistor and the P-channel type transistor.

An edge portion of a bank layer 21 is preferably in the form of having a radius of curvature varying continuously as illustrated in FIG. 1. The bank layer 21 is made from acrylic, siloxane (a substance which has a skeleton formed by the bond of silicon (Si) and oxygen (O), and which includes at least hydrogen as a substituent), resist, silicon oxide, or the like. The bank layer 21 may be formed by at least one of an inorganic film or an organic film, alternatively, both of the films.

A light-emitting element 24 may have the structure in which a first electrode 20 serves as an anode and a second electrode 23 serves as a cathode, alternatively, the structure in which the first electrode 20 serves as a cathode and a second electrode 23 serves as an anode. Further, the transistor 16 is a P-channel transistor in the case of forming the former structure, whereas the transistor 16 is an N-channel transistor in the case of forming the latter structure.

A light-emitting device according to the present invention is composed of a plurality of pixels, each of which includes the foregoing light-emitting element 24 and transistor 16, in a matrix configuration. A light-emitting layer may have the structure in which each of light-emitting layers having different emission wavelength bands is respectively provided to each pixel for color display. Typically, light-emitting layers corresponding to color of R (red), G (green), and B (blue) are formed. In this instance, color purity can be improved and a pixel portion can be prevented from being a mirror surface (reflection) by providing a filter (colored layer) transparent to light in each emission wavelength region at the light emission side of the pixel. By providing the filter (colored layer), a circularly-polarized light plate or the like that is conventionally required becomes not required, further, light can be emitted from the light-emitting layer without loss of light. Moreover, color changes occurred in the case of viewing obliquely the pixel portion (display screen) can be further reduced.

The light-emitting layer may have the structure of exhibiting mono color emission or white emission to be used in color display, instead of the structure of providing light-emitting layers corresponding to each color as mentioned above. In the case of using a white light-emitting material, color display can be realized by providing a filter (colored layer) transparent to light at a particular wavelength at a light emission side of a pixel.

To form a light-emitting layer that exhibits white emission, for example, $Alq_3$, $Alq_3$ partly doped with Nile red, p-EtTAZ, TPD (aromatic diamine) are deposited sequentially by vapor deposition. In the case that the light-emitting layer is formed by spin coating, the material is preferably baked by vacuum heating after being coated. For example, poly(ethylene dioxythiophene)/poly(styrene sulfonate) solution (PEDOT/PSS) may be coated over a whole surface and baked, and a solution of polyvinylcarbazole (PVK) doped with pigments (1,1,4,4-tetraphenyl-1,3-butadiene (abbreviated TPB), 4-dicyanomethylene-2-methyl-6-(p-dimethylamino-styryl)-4H-pyran (DCM1), Nile red, coumarin 6, or the like) may be coated over a whole surface and baked.

The light-emitting layer may be formed by a single layer besides a multilayer as mentioned above. In this instance, the light-emitting layer may be made from polyvinylcarbazole (PVK) dispersed with a 1,3,4-oxadiazole derivative (PBD). Further, white emission can be obtained by dispersing PBD of 30 wt % and dispersing an appropriate amount of four kinds of pigments (TPB, coumarin 6, DCM1, and Nile red).

A light-emitting element that is a component of a light-emitting device according to the present invention emits light under forward bias. A pixel of a display device formed by using the light-emitting element can drive by an active matrix driving technique. At any rate, each pixel is emitted by applying forward bias at a specified timing. Further, the respective pixels are in non-emission state for a certain period. The reliability of the light-emitting element can be improved by applying reverse bias in the period in which the pixels are in the non-emission state. The light-emitting element may be in deterioration mode of lowering emission intensity under a regular driving condition or may be in deterioration mode of lowering apparently luminance due to the expansion of a non-emission region within the pixel. The deterioration progression can be delayed by AC drive of applying forward bias and reverse bias, which leads to the improvement of the reliability of the light-emitting device.

The foregoing structure can be applied not only to the light-emitting device according to the present invention as illustrated in FIG. 1 but another light-emitting device according to the present invention.

Example 2

In this example, a circuit provided to a pixel portion for driving a light-emitting element in a light-emitting device according to the present invention is explained. Further, the circuit for driving the light-emitting element is not limited to that explained in this example.

Figure 5:
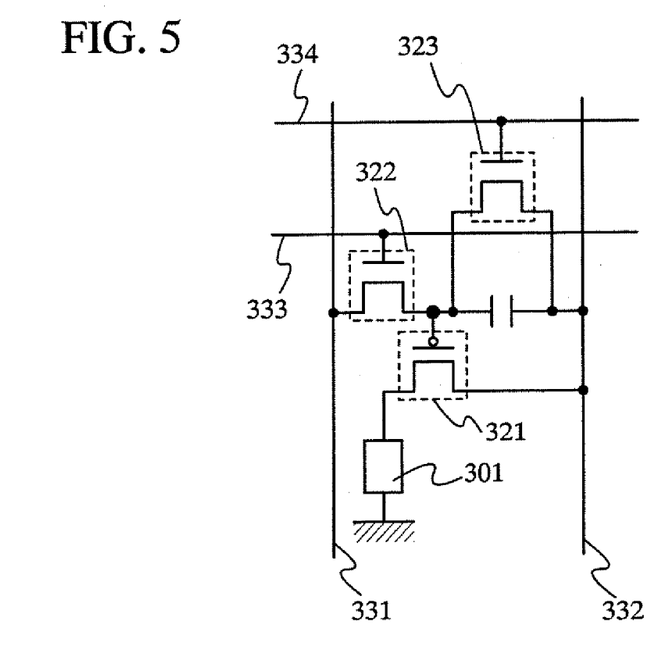
FIG. 5 is an explanatory view of a circuit for operating a light-emitting device according to the present invention.

As illustrated in FIG. 5, a light-emitting element 301 is connected to a circuit for driving each light-emitting element. The circuit has a driving transistor 321 for determining emission or non-emission of the light-emitting element 301 by an image signal, a switching transistor 322 for controlling input of the image signal, and an erasing transistor 323 for making the light-emitting element 301 be in a non-emission state regardless of the image signal. A source (or drain) of the switching transistor 322 connects to a source signal line 331, a source of the driving transistor 321 and a source of the erasing transistor 323 connect to a current supply line 332 extending in parallel with the source signal line 331, and a gate of the erasing transistor 323 extending in parallel with a first scanning line 333 connects to a second scanning line 334. Further, the driving transistor 321 connects to in series with the light-emitting element 301.

A method for driving the light-emitting element 301 when the light-emitting element 301 emits light is explained. Upon the first scanning line 333 being selected in a write period, the switching transistor 322 whose gate is connected to the first scanning line 333 is turned ON. An image signal inputted to the source signal line 331 is inputted to a gate of the driving transistor 321 via the switching transistor 322. Then, current is flown from the current supply line 332 to the light-emitting element 301, which leads to green emission, for example. Luminance of the emission depends on an amount of the current flow in the light-emitting element 301.

The light-emitting element 301 corresponds to a light-emitting element 24 in FIG. 1, and the driving transistor 321 corresponds to a transistor 16 in FIG. 1. The erasing transistor 323 corresponds to a transistor 28 in FIG. 2, and the switching transistor 322 corresponds to a transistor 27 in FIG. 2. Further, the source signal line 331 corresponds to a wiring 19c in FIG. 2, the current supply line 332 corresponds to 19b in FIG. 2, the first scanning line 333 corresponds to a wiring 29a in FIG. 2, and the second scanning line 334 corresponds to a wiring 29b in FIG. 2.

The structure of the circuit connected to each light-emitting element is not limited to that explained in this example. The circuit may have other structure than the foregoing structure as illustrated in FIG. 6.

Figure 6:
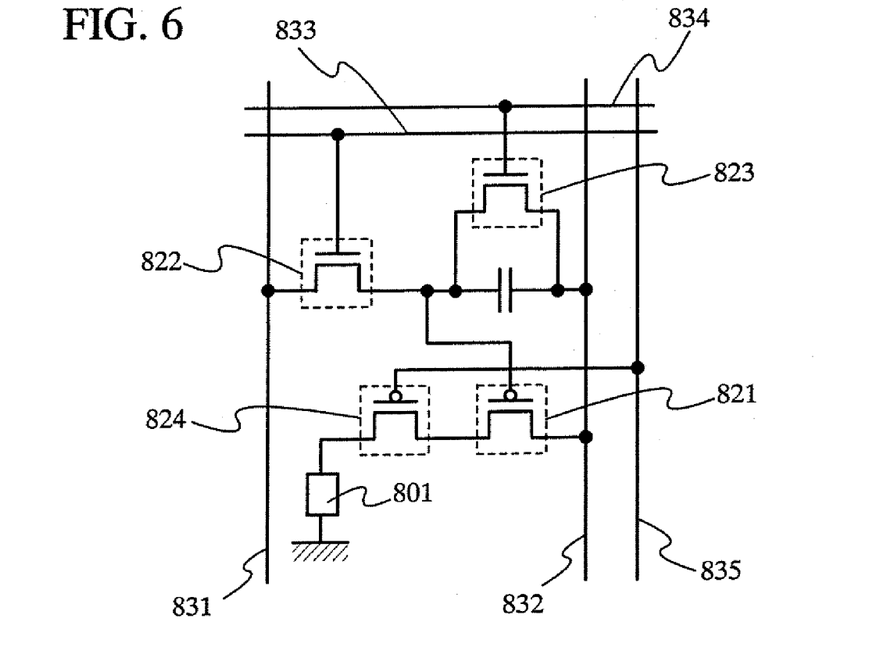
FIG. 6 is an explanatory view of a circuit for operating a light-emitting device according to the present invention.

A circuit illustrated in FIG. 6 is then explained.

As illustrated in FIG. 6, a light-emitting element 801 is connected to a circuit for driving each light-emitting element. The circuit has a driving transistor 821 for determining emission or non-emission of the light-emitting element 801 by an image signal, a switching transistor 822 for controlling input of the image signal, an erasing transistor 823 for making the light-emitting element 801 be in a non-emission state regardless of the image signal, and a current controlling transistor 824 for controlling an amount of current supplied to the light-emitting element 801. A source (or drain) of the switching transistor 822 connects to a source signal line 831, a source of the driving transistor 821 and a source of the erasing transistor 823 connect to a current supply line 832 extending in parallel with the source signal line 831, a gate of the switching transistor 822 connects to a first scanning line 833, and a gate of the erasing transistor 823 extending in parallel with a first scanning line 833 connects to a second scanning line 834. Further, the driving transistor 821 connects to in series with the light-emitting element 801 via the current controlling transistor 824. A gate of the current controlling transistor 824 connects to a power source line 835. In addition, the current controlling transistor 824 is constructed and controlled so that current flows in a saturation region in voltage-current (Vd-Id) characteristics. Accordingly, an amount of value of current flown in the current controlling transistor 824 can be determined.

A method for driving the light-emitting element 801 when the light-emitting element 801 emits light is explained. Upon the first scanning line 833 being selected in a write period, the switching transistor 822 whose gate is connected to the first scanning line 833 is turned ON. An image signal inputted to the source signal line 831 is inputted to a gate of the driving transistor 821 via the switching transistor 822. Further, current flows from the current supply line 832 to the light-emitting element 801 via the driving transistor 821 and the current controlling transistor 824 that becomes in ON state due to a signal from the power source line 835, which leads to light emission. The amount of current flown in the light-emitting element depends on the current controlling transistor 824.

Example 3

A light-emitting device according to the present invention can extract efficiently light from a light-emitting layer to the outside. Therefore, an electric appliance mounted with the light-emitting device according to the present invention requires a small amount of power for a display function. Since the variation of an emission spectrum that depends on an angle of viewing a light extraction surface is small, the electric appliance mounted with the light-emitting device according to the present invention can obtain an image with favorable visibility. Hereinafter, an electric appliance and the like mounted with the light-emitting device according to the present invention are explained.

A light-emitting device according to the present invention is mounted to various kinds of electric appliances after being installed and sealed with an external input terminal.

In this example, a light-emitting device according to the present invention after sealing and electric appliances mounted with the light-emitting device are explained with reference to FIGS. 7 to 9C. FIGS. 7 to 9C illustrate only one example and the structure of the light-emitting device is not limited thereto.

A light-emitting device according to the present invention is explained with reference to FIGS. 7 and 8. FIG. 8 is a cross-sectional view of FIG. 7.

Figure 7:
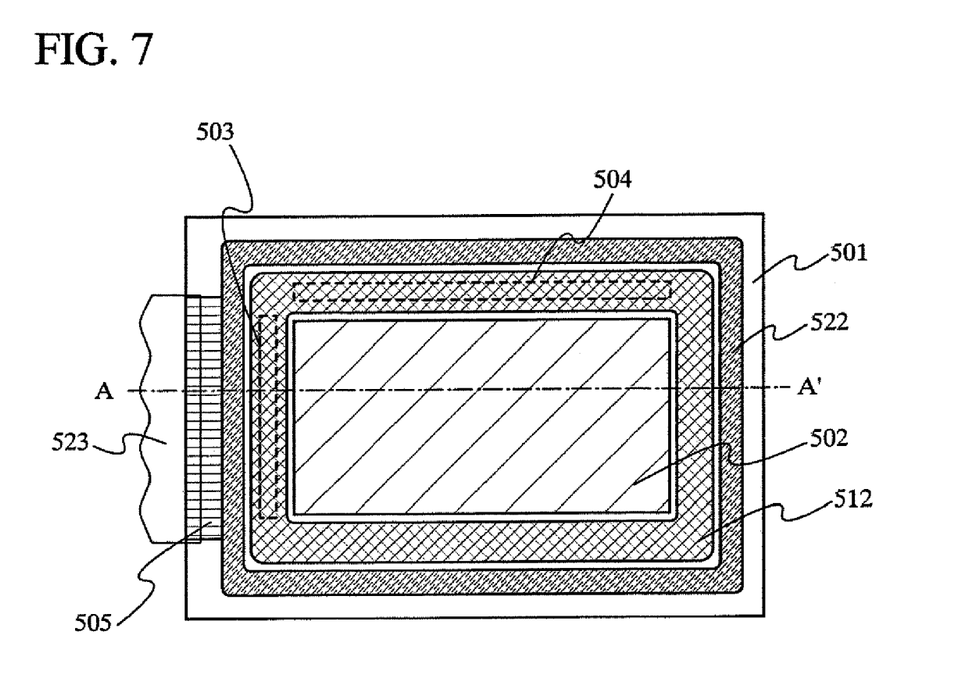
FIG. 7 is an explanatory top view of a light-emitting device according to the present invention after being sealed.
Figure 8:
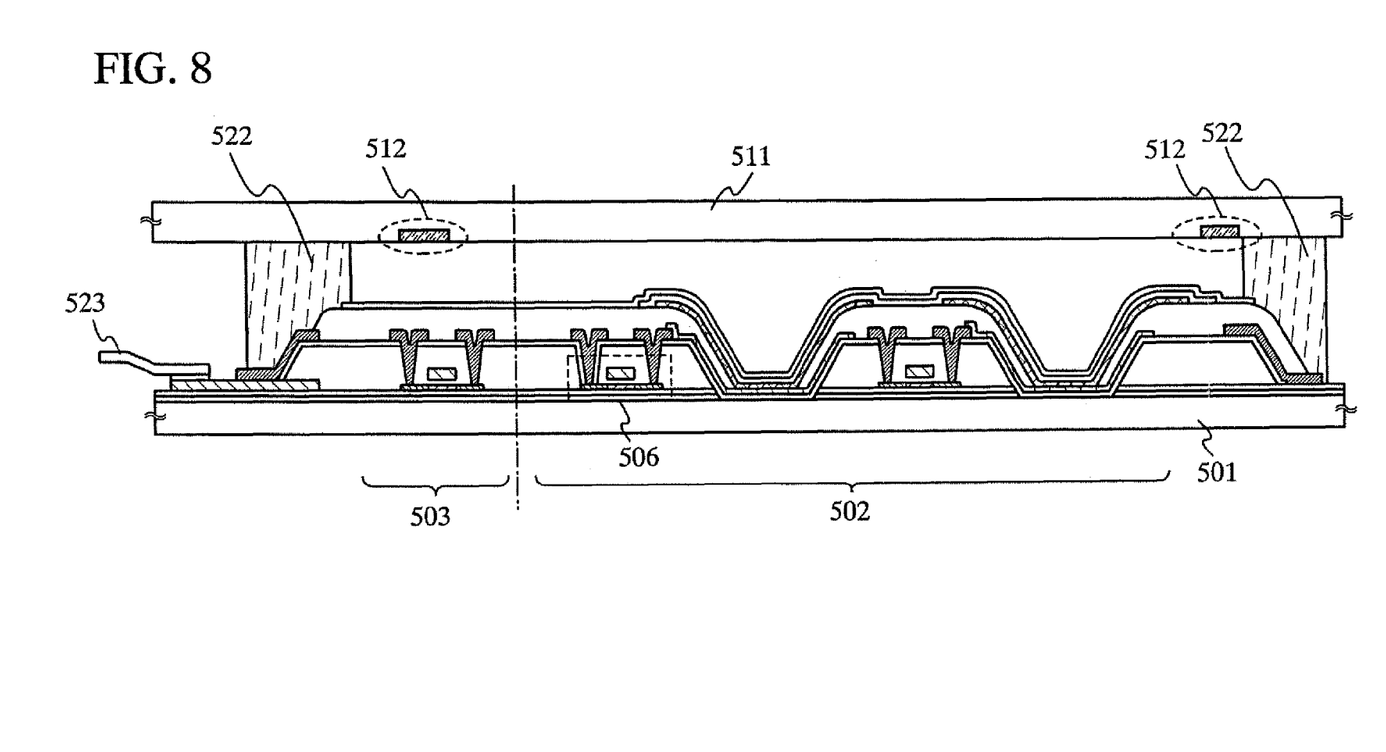
FIG. 8 is an explanatory cross-sectional view of a light-emitting device according to the present invention after being sealed.

As illustrated in FIG. 7, a pixel portion 502, driving circuit portions 503, transistor 504 formed in the pixel portion 502, and a connecting terminal portion 505 are provided over a first substrate 501 formed by a glass. The driving circuit portions 503 is respectively provided along edges of the pixel portion 502. The connecting terminal portion 505 is provided adjacent to the driving circuit portion 503 to be connected to the driving circuit portion 503 by a wiring. In this example, a glass substrate is used as the first substrate 501. Besides, a quartz substrate, a flexible substrate such as a plastic substrate, or the like can be used.

The pixel portion 502 is provided with a light-emitting element and a circuit element (that is each portion unit for composing a circuit, for example, transistor, resistance, and the like) for driving the light-emitting element. FIG. 8 is a schematic view of a cross-sectional structure of the first substrate 501. The present invention is practiced in the pixel portion 502.

A material having a water absorbing property is secured to a second substrate 511 provided opposite to the first substrate 501. In FIG. 8, a region 512 to which the material having a water absorbing property is secured is provided to the outside of the pixel portion 502 and along with the edge of the pixel portion 502. In FIG. 7, the region 512 is overlapped with the driving circuit portion 503 and the transistor 506. In this example, granular calcium oxide is used as the material having a water absorbing property. A concave portion is provided to a part of the second substrate 511 to secure the calcium oxide to the concave portion using ester acrylate as fixative.

In this example, a glass substrate is used as the second substrate 511. Besides, a quartz substrate, a flexible substrate such as a plastic substrate, or the like can be used. A material having high moisture permeability can be used as fixative instead of using the ester acrylate. An inorganic material such as siloxane can be used as fixative other than resin. In this example, fixative is solidified by heating. Further, a material having high moisture permeability that includes polymerization initiator and is hardened by light can be used as fixative. In this example, granular calcium oxide is used as the material having a water adsorbing property, but not exclusively, another material having a water adsorbing property can be used. Alternatively, a composite formed by molecules having water adsorbing property by chemical adsorption mixed in organic solvent, which is injected into the concave portion and solidified, can be used.

The first substrate 501 and second substrate 511 are pasted to each other by sealant 522 so that the light-emitting element, transistor, and the like are sealed inside these substrates. A flexible printed wiring board (FPC) 523 is connected to the driving circuit portion 503 and the like via the connecting terminal portion 505.

Space (inside the light-emitting device) surrounded by the first substrate 501, the second substrate 511, and the sealant 522 is filled with an inert gas such as nitrogen. The space surrounded by the first substrate 501, the second substrate 511, and the sealant 522 may be filled with a resin material instead of gas as in this example. A layer or multiple layers for preventing moisture from penetrating into the space may be provided over the side provided to the material having a water absorbing property of the second substrate 511.

Since there is no obstruction of light extraction from the pixel portion 502 to the outside in the above described light-emitting device according to the present invention, the light-emitting device can be used effectively in the case of extracting light from the second electrode (that is provided opposite to a substrate via a light-emitting layer) of the light-emitting element. Further, since the material having a water absorbing property is secured in the region 512, the material having a water absorbing property will not be in contact with the driving circuit portion 503 and the transistor 506 even if the first substrate 501 and the second substrate 511 are pressed to be pasted to each other. Accordingly, the material having a water absorbing property can prevent the driving circuit portion 503 and the transistor 506 from being damaged.

Figures 9A, 9B, 9C:
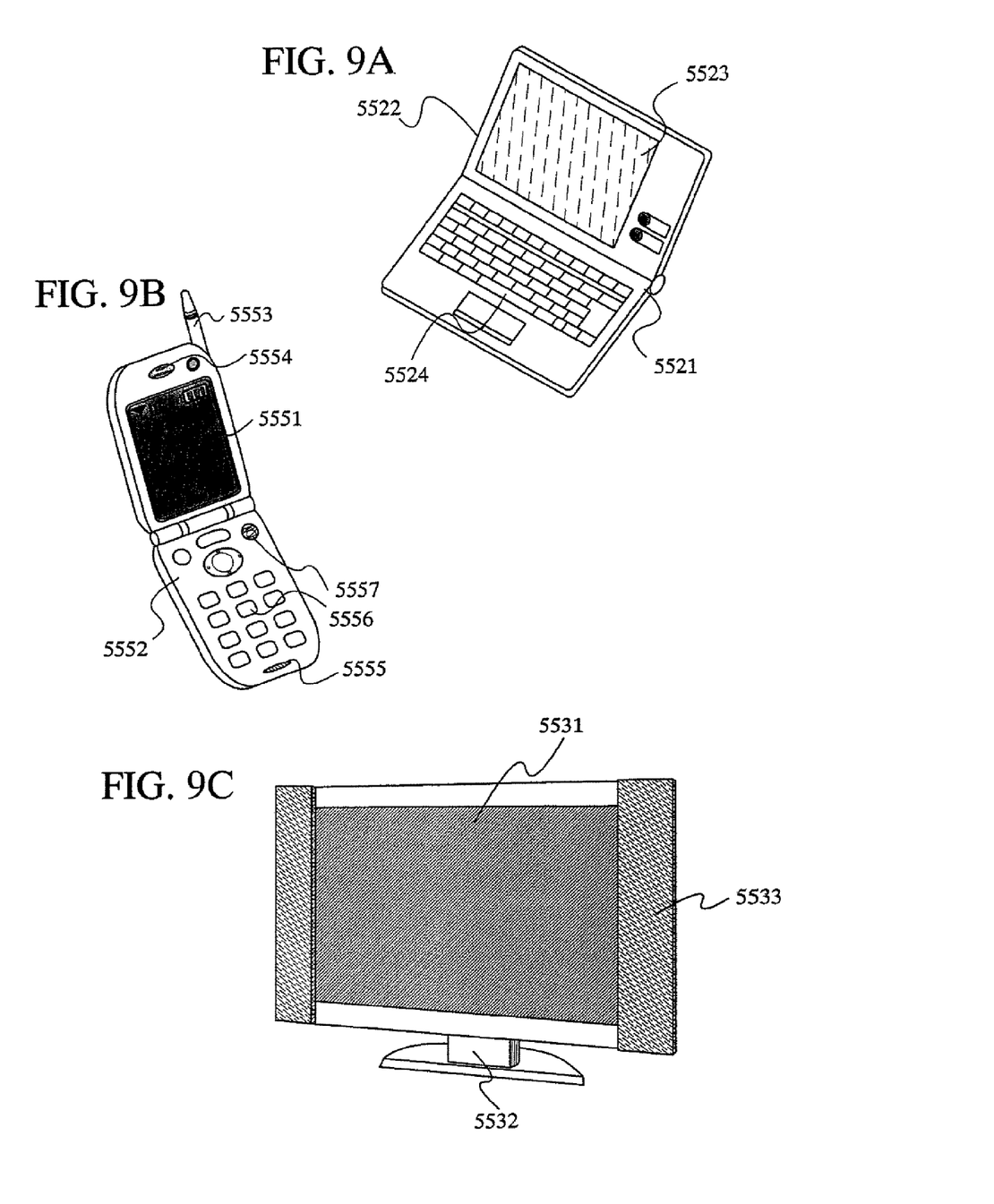
FIGS. 9A to 9C are explanatory views of electric appliances practicing the present invention.

FIGS. 9A to 9C illustrate one embodiment of electric appliances mounted with the light-emitting device according to the present invention.

FIG. 9A illustrates a personal computer manufactured by practicing the present invention composed of a main body 5521, a housing 5522, a display portion 5523, a key board 5524, and the like. The personal computer can be completed by incorporating a light-emitting device having a light-emitting element according to the present invention as a display portion.

FIG. 9B illustrates a cellular phone manufactured by practicing the present invention composed of a main body 5552, a display portion 5551, a sound output portion 5554, a sound input portion 5555, operation switches 5556, 5557, an antenna 5553, and the like. The cellular phone can be completed by incorporating a light-emitting device having a light-emitting element according to the present invention as a display portion.

FIG. 9C illustrates a television set manufactured by practicing the present invention composed of a display portion 5531, a housing 5532, a speaker 5533, and the like. The television set can be completed by incorporating a light-emitting device having a light-emitting element according to the present invention as a display portion.

As noted above, the light-emitting device according to the present invention is extremely suitable to be used as a display portion of various kinds of electric appliances.

A personal computer is explained in this example. Besides, a light-emitting device having a light-emitting element according to the present invention may be mounted to a car navigation system, a lighting system, and the like.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A display device comprising:
   a first substrate;
   a pixel portion including a light-emitting element and a driving circuit portion, both formed over the first substrate;
   a second substrate over the pixel portion and the driving circuit portion, wherein the second substrate contains a concave portion;
   a sealant between the first substrate and the second substrate; and
   a material having a water absorbing property formed in the concave portion, wherein the material having the water absorbing property is provided so as to surround a periphery of the pixel portion, and so as to be spaced from the sealant.

2. A display device according to claim 1, wherein at least one of the first substrate and the second substrate contains a plastic.

3. A display device according to claim 1, wherein the material having the water absorbing property contains calcium oxide.

4. A display device according to claim 1, wherein the material having the water absorbing property is provided so as to overlap the driving circuit portion.

5. A display device according to claim 1, wherein the display device is an active matrix light-emitting device.

6. A display device according to claim 1, wherein the display device is incorporated in one selected from the group consisting of a personal computer, a cellular phone, a television set, a navigation system, and a lighting system.

7. A display device comprising:
a first substrate;
a pixel portion including a light-emitting element and a driving circuit portion, both formed over the first substrate;
a second substrate over the pixel portion and the driving circuit portion, wherein the second substrate contains a concave portion;
a sealant between the first substrate and the second substrate; and
a material having a water absorbing property formed in the concave portion, wherein the material having the water absorbing property is provided so as not to overlap the pixel portion, so as to surround a periphery of the pixel portion, and so as to be spaced from the sealant.

8. A display device according to claim 7, wherein at least one of the first substrate and the second substrate contains a plastic.

9. A display device according to claim 7, wherein the material having the water absorbing property contains calcium oxide.

10. A display device according to claim 7, wherein the material having the water absorbing property is provided so as to overlap the driving circuit portion.

11. A display device according to claim 7, wherein the display device is an active matrix light-emitting device.

12. A display device according to claim 7, wherein the display device is incorporated in one selected from the group consisting of a personal computer, a cellular phone, a television set, a navigation system, and a lighting system.

13. A display device comprising:
a first substrate;
a pixel portion including a light-emitting element formed over the first substrate;
a second substrate over the pixel portion, wherein the second substrate contains a concave portion;
a sealant between the first substrate and the second substrate; and
a material having a water absorbing property formed in the concave portion, wherein the material having the water absorbing property is provided so as to surround a periphery of the pixel portion, and so as to be spaced from the sealant.

14. A display device according to claim 13, wherein at least one of the first substrate and the second substrate contains a plastic.

15. A display device according to claim 13, wherein the material having the water absorbing property contains calcium oxide.

16. A display device according to claim 13, wherein the display device is an active matrix light-emitting device.

17. A display device according to claim 13, wherein the display device is incorporated in one selected from the group consisting of a personal computer, a cellular phone, a television set, a navigation system, and a lighting system.

18. A display device comprising:
a first substrate;
a pixel portion including a light-emitting element formed over the first substrate;
a second substrate over the pixel portion, wherein the second substrate contains a concave portion;
a sealant between the first substrate and the second substrate; and
a material having a water absorbing property formed in the concave portion, wherein the material having the water absorbing property is provided so as not to overlap the pixel portion, so as to surround a periphery of the pixel portion, and so as to be spaced from the sealant.

19. A display device according to claim 18, wherein at least one of the first substrate and the second substrate contains a plastic.

20. A display device according to claim 18, wherein the material having the water absorbing property contains calcium oxide.

21. A display device according to claim 18, wherein the display device is an active matrix light-emitting device.

22. A display device according to claim 18, wherein the display device is incorporated in one selected from the group consisting of a personal computer, a cellular phone, a television set, a navigation system, and a lighting system.

* * * * *